United States Patent
Le Vaillant

(10) Patent No.: US 7,465,646 B2
(45) Date of Patent: Dec. 16, 2008

(54) METHODS FOR FABRICATING A WAFER STRUCTURE HAVING A STRAINED SILICON UTILITY LAYER

(75) Inventor: Yves-Matthieu Le Vaillant, Crolles (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 163 days.

(21) Appl. No.: 11/080,936

(22) Filed: Mar. 14, 2005

(65) Prior Publication Data

US 2006/0081847 A1  Apr. 20, 2006

(30) Foreign Application Priority Data

Oct. 19, 2004  (EP) .................................. 04292482

(51) Int. Cl.
*H01L 21/30* (2006.01)
(52) U.S. Cl. ....................................... 438/458; 438/455
(58) Field of Classification Search ................. 438/149, 438/455, 700
See application file for complete search history.

(56) References Cited

U.S. PATENT DOCUMENTS

| | | | | |
|---|---|---|---|---|
| 5,759,898 A | * | 6/1998 | Ek et al. ...................... | 438/291 |
| 5,788,763 A | | 8/1998 | Hayashi et al. ................ | 117/2 |
| 6,403,450 B1 | | 6/2002 | Maleville et al. ............ | 438/471 |
| 6,995,430 B2 | * | 2/2006 | Langdo et al. ............... | 257/352 |
| 2002/0146892 A1 | * | 10/2002 | Notsu et al. .................. | 438/455 |
| 2004/0005740 A1 | | 1/2004 | Lochtefeld et al. .......... | 438/149 |

FOREIGN PATENT DOCUMENTS

| | | |
|---|---|---|
| EP | 0 328 817 A2 | 8/1989 |
| EP | 1 248 294 A2 | 10/1992 |
| EP | 0 506 416 B1 | 8/2002 |
| FR | 2 777 115 | 8/1999 |
| JP | 2003 022975 | 1/2003 |
| WO | WO 2004/019404 | 3/2004 |

* cited by examiner

*Primary Examiner*—Zandra Smith
*Assistant Examiner*—Sonya D McCall Shepard
(74) *Attorney, Agent, or Firm*—Winston & Strawn LLP

(57) ABSTRACT

Methods for fabricating a wafer structure having a strained silicon utility layer are described. In an embodiment, the method includes providing a prototype wafer having at least a support substrate and a strained silicon model layer upon the support substrate, and then providing a relaxed silicon-germanium layer on the strained silicon model layer. Next, a strained silicon utility layer is provided on the relaxed silicon-germanium layer to form an intermediate structure. The strained silicon utility layer has substantially the same characteristics as the strained silicon model layer. The method also includes detaching the strained silicon utility layer from the intermediate structure at a predetermined zone of weakness in the relaxed silicon-germanium layer to form a wafer structure having a strained silicon utility layer.

13 Claims, 3 Drawing Sheets

METHODS FOR FABRICATING A WAFER STRUCTURE HAVING A STRAINED SILICON UTILITY LAYER

BACKGROUND ART

The present invention generally relates to methods for fabricating a wafer structure having a strained silicon layer, and to an intermediate product for fabricating such a wafer structure.

Fabricating semiconductor structures that include a strained silicon layer are very interesting for microelectronic or optoelectronic applications since strained silicon layers have excellent electronic properties. The electronic properties include an increased carrier mobility that results in high efficiency electronic products. Conventional methods for fabricating structures with strained silicon layers are very complex and time-consuming. In particular, it is known to epitaxially grow a SiGe buffer layer on a silicon substrate, and such a buffer layer has a gradually increasing germanium content. The SiGe buffer layer is normally epitaxially grown over a relatively long period of time with only slight changes of germanium content, resulting in a portion on top of the SiGe layer having a very low dislocation density. Then, a relaxed SiGe layer having a constant germanium concentration corresponding to the highest germanium concentration of the SiGe buffer layer is formed on the SiGe buffer layer. A strained silicon layer is next formed thereon. The requirements for first achieving a high quality of strained silicon structures and second for achieving high production efficiency are at odds with each other, because time-consuming process steps are necessary to obtain high quality structures.

Another method for fabricating SGOI (silicon-germanium-on-insulator) structures includes using the SMART-CUT® process. In particular, a relaxed SiGe layer is formed on a silicon support substrate and is then detached. Thereafter, strained epitaxial silicon is formed on the detached SiGe layer. This technique for fabricating such SGOI layers is time consuming and complex since the formation of the SiGe layer must be repeated for each new wafer product. Thus, each new structure requires conducting at least two epitaxy processes.

There are several disadvantages associated with the above described technologies including the need to repeat complex processing steps, and the difficulty of recycling the original substrates from which a layer has been detached. Chemical mechanical polishing steps and/or chemical etching steps are used to bring the original substrate to a state in which it is reusable. Such recycling processes are used to reduce the surface roughness and to remove a step profile formed on the edge of the wafers, but also reduce the thickness of the original wafer. Such steps are also time-consuming. Moreover, it is difficult to use chemical etching since it is not selective enough to recognize the interface between a SiGe layer having a gradually changing composition and the silicon substrate. It is therefore necessary to apply a complementary chemical-mechanical polishing step, or to replace chemical etching with a chemical-mechanical polishing step. Chemical-mechanical polishing steps are not easily reproducible, and are somewhat inefficient.

International published application WO 2004 019 404 describes a method that utilizes protective layers such as stop layers to protect a layer that is located under a recycled layer during the recycling process. Although such stop layers are able to protect an SiGe buffer layer on a donor or support substrate, such a method cannot solve all the problems inherent in the prior art. In particular, the SiGe buffer layer has been subjected to multiple processing steps which form dislocations so that long-term epitaxial processes are necessary to form a new usable donor wafer, wherein the dislocation density is greatly reduced to form a good base to form a high-quality strained silicon layer.

In another approach, only a part of the relaxed SiGe layer is transferred onto another substrate and is further grown thereon to provide a good base for a strained silicon layer. This technique eliminates the need to form a buffer layer and thus results in increasing the efficiency of the process. The technique also eliminates the risk of a forming dislocations when fabricating the buffer layer. However, as mentioned above, performing repeated SiGe epitaxy on the transferred SiGe layer is difficult to control which leads to inefficiency. For instance, pre-treating the surface of SiGe layers before epitaxially depositing SiGe is typically more difficult than depositing a strained Si layer.

SUMMARY OF THE INVENTION

The present invention provides methods and an intermediate product that permits efficient fabrication of a structure that includes a strained silicon utility layer, wherein a donor or support substrate used in the method can be efficiently recycled. An aspect according to the present method includes providing a prototype wafer having at least a support substrate and a strained silicon model layer upon the support substrate, and then providing a relaxed silicon-germanium layer on the strained silicon model layer. Next, a strained silicon utility layer is provided on the relaxed silicon-germanium layer to form an intermediate structure. The strained silicon utility layer has substantially the same characteristics as the strained silicon model layer. The method then includes detaching the strained silicon utility layer from the intermediate structure at a predetermined zone of weakness in the relaxed silicon-germanium layer to form a wafer structure having a strained silicon utility layer.

Advantageously, the method further includes, after the detaching step, removing any residual portions of the relaxed silicon-germanium layer from the strained silicon utility layer. In a beneficial embodiment, the relaxed silicon-germanium layer, the strained silicon utility layer, or both layers are provided by epitaxial growing of the layer. In addition, both layers may be provided by epitaxial growing, and the method may further include epitaxially growing the strained silicon model layer before epitaxially growing the relaxed silicon-germanium layer thereon.

According to an advantageous aspect of the invention, the relaxed silicon-germanium layer is provided at a sufficient thickness to accommodate the weakened layer therein. In addition, atomic species may be implanted into the relaxed silicon germanium layer to create the predetermined weakened zone therein. In a variation, the method also includes, prior to the detaching step, bonding a second wafer to the strained silicon utility layer. In another variation, prior to the detaching step, a silicon-germanium utility layer is grown on the strained silicon utility layer, and a second wafer may be bonded onto the silicon-germanium utility layer before the detaching step.

Another advantageous aspect according to the invention includes removing any residual portions of the relaxed silicon-germanium layer from the strained silicon model layer after the detachment step, so that the prototype wafer can be recycled. In a beneficial embodiment, the prototype wafer is a silicon on insulator structure that includes at least one insulator layer between the silicon support substrate and the strained silicon model layer. In another advantageous implementation, the prototype wafer is a silicon-germanium on insulator structure that includes at least one insulator layer and a silicon-germanium layer between the silicon support substrate and the strained silicon model layer.

Another aspect according to the invention provides an intermediate structure for fabricating a semiconductor wafer. The intermediate structure includes a prototype wafer having at least a support substrate and a strained silicon model layer, a relaxed silicon-germanium layer grown on the strained silicon model layer, and a strained silicon utility layer grown on the relaxed silicon-germanium layer. The relaxed silicon-germanium layer includes a predetermined weakened zone therein, and the strained silicon utility layer has substantially the same characteristics as the strained silicon model layer.

In an advantageous embodiment, the intermediate structure further includes a second wafer bonded to the strained silicon utility layer. In addition, the structure may include a silicon-germanium utility layer on the strained silicon utility layer. In a beneficial implementation, a second wafer bonded to the silicon-germanium utility layer is provided. In an advantageous variation, a second strained silicon model layer is provided between the strained silicon model layer and the relaxed silicon-germanium layer.

Advantageously, the intermediate structure includes a prototype wafer that is a silicon on insulator wafer that includes at least one insulator layer between the silicon support substrate and the strained silicon model layer. In a beneficial variation, the prototype wafer is a silicon-germanium on insulator wafer that includes at least one insulator layer and a silicon-germanium layer between the silicon support substrate and the strained silicon model layer.

BRIEF DESCRIPTION OF THE DRAWING FIGURES

Other aspects, purposes and advantages of the invention will become clear after reading the following detailed description with reference to the attached drawings, in which.

DETAILED DESCRIPTION OF THE PREFERRED EMBODIMENTS

Figure 1:
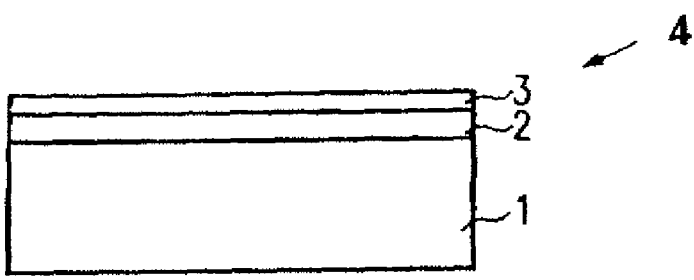
FIG. 1 is a simplified schematic view of a prototype wafer according to the present invention.

FIG. 1 is a schematic view of a silicon-on-insulator (SOI) prototype wafer 4. The prototype wafer 4 includes a silicon substrate 1, an insulator layer 2 formed thereon, and a strained silicon model layer 3 on top. The silicon substrate 1 supports the insulator layer 2 and the strained silicon model layer 3. The insulator layer 2 may be, for example, made of silicon dioxide, and in other examples may be made of silicon nitride or another insulating material or insulating materials. The strained silicon model layer 3 has been formed on the prototype wafer, for example, by using a SMART-CUT® process. Alternatively, the layer 3 can be formed by another method known in the art.

Figure 2:
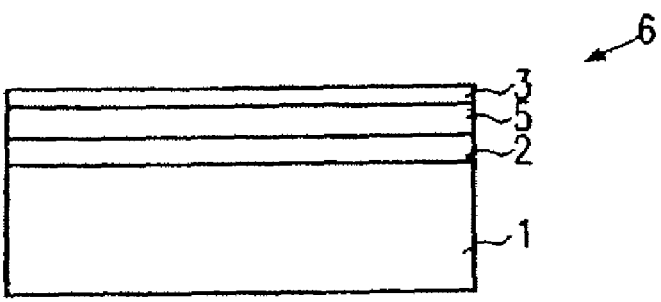
FIG. 2 is a simplified schematic view of another prototype wafer according to the present invention.

FIG. 2 illustrates another prototype wafer 6 that includes a silicon substrate 1, an insulator layer 2, a silicon-germanium (SiGe) layer 5, and a strained silicon model layer 3 on top. The germanium content of the relaxed SiGe layer 5 determines the strain of the strained silicon model layer 3 that is on top of the relaxed SiGe layer 5. The prototype wafer 6 can be formed by using the SMART-CUT® process, or by using any other process known in the art.

Figure 3:
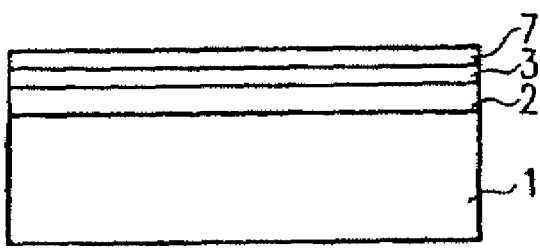
FIG. 3 shows the prototype wafer of FIG. 1 after formation of a strained silicon model layer thereon.

FIG. 3 illustrates the prototype wafer 4 of FIG. 1 after epitaxially growing a further strained silicon model layer 7. The characteristics of the additional strained silicon model layer 7 are substantially similar to the characteristics of the strained silicon model layer 3. The additional strained silicon model layer 7 effectively increases the thickness of the strained silicon model layer 3, which serves to compensate for any loss of thickness during a subsequent recycling step involving the prototype wafer.

Figure 4:
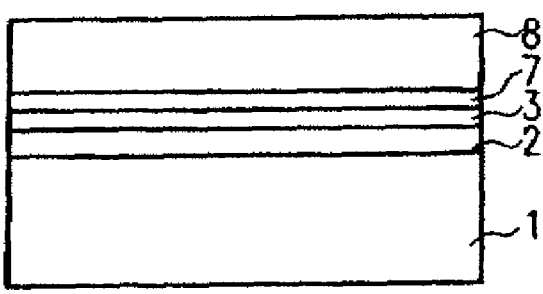
FIG. 4 shows the structure of FIG. 3 after formation of a relaxed auxiliary SiGe layer thereon.

FIG. 4 illustrates the structure of FIG. 3 after formation of a relaxed auxiliary SiGe layer 8 on the additional strained silicon model layer 7. The relaxed auxiliary SiGe layer 8 has, in this example, a constant germanium content.

Figure 5:
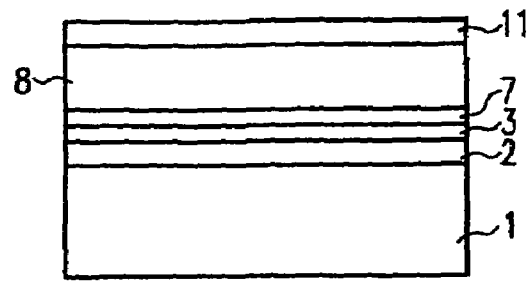
FIG. 5 shows the structure of FIG. 4 after formation of a strained silicon utility layer thereon.

FIG. 5 shows the structure of FIG. 4 after formation of a strained silicon utility layer 11 on the relaxed auxiliary SiGe layer. The strained silicon utility layer 11 has strain characteristics which are substantially the same as the strain characteristics of the strained silicon model layer 7. The properties of the strained silicon layers 7 and 11 are duplicated or cloned by means of the relaxed auxiliary SiGe layer between the strained silicon layers 7 and 11. FIG. 5 shows an embodiment of an intermediate structure according to the present invention, which consists of the prototype wafer 4, the relaxed auxiliary SiGe layer 8 with a predetermined weakened zone 9 formed therein, and a top strained silicon utility layer 11.

Figure 6:
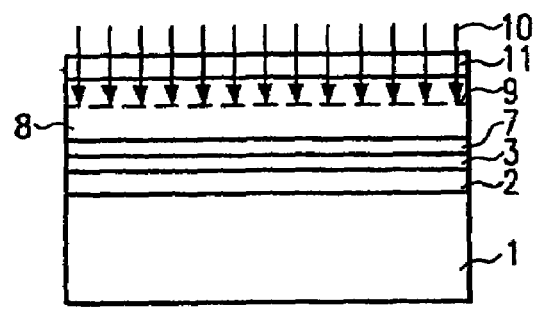
FIG. 6 shows the structure of FIG. 5 during an implantation step.

FIG. 6 schematically shows the structure of FIG. 5 during an implantation step. In FIG. 5, atomic species 10 are implanted into a certain depth of the relaxed auxiliary SiGe layer 8 to form predetermined weakened zone 9 therein. The structure of the SiGe layer is weakened at the predetermined weakened zone 9 so that a mechanical force, or a thermal influence, or shockwaves can be applied to delaminate or detach a structure at the predetermined weakened zone as shown in FIG. 6.

Figure 7:
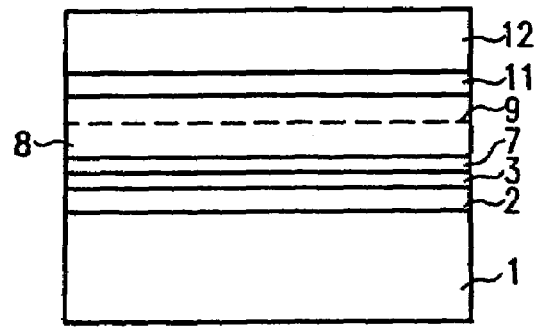
FIG. 7 shows the structure of FIG. 6 after formation of a silicon-germanium utility layer thereon.

FIG. 7 illustrates the structure of FIG. 6 after formation of an SiGe utility layer 12 on the strained silicon utility layer 11. The SiGe utility layer 12 together with the strained silicon utility layer 11 forms at least a part of a utility structure, which may be a silicon-geranium-on-insulator (SGOI) utility structure.

Figure 8:
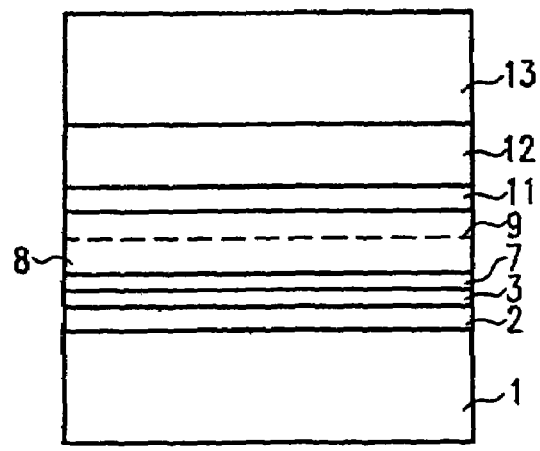
FIG. 8 shows the structure of FIG. 7 bonded onto a second wafer.

FIG. 8 shows the surface of the SiGe utility layer of the structure of FIG. 7 bonded to a second wafer 13. The second wafer 13 forms a support for the SiGe utility layer 12 and the strained silicon utility layer 11 during detachment, and the second wafer is thereafter a good carrier for the SiGe utility layer 12 and the strained silicon utility layer 11. In particular, the structure of FIG. 8 is detached after the bonding step by using, for example, a mechanical force, a thermal influence, or shockwaves, or a combination of such forces or influences. The structure of FIG. 8 is separated along the predetermined zone of weakness 9 resulting in the two structures, the first shown in FIG. 9 and the second shown in FIG. 11.

Figure 9:
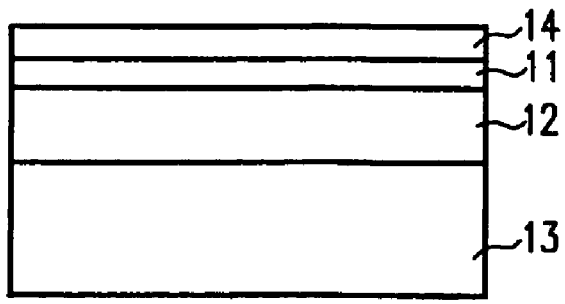
FIG. 9 shows one part of the structure of FIG. 8 after a detachment step.

FIG. 9 shows one detached part of the structure of FIG. 8 after the detachment step. The first detached part includes the second wafer 13, the SiGe utility layer 12, the strained silicon utility layer 11, and a residual part 14 which is a part of the former relaxed auxiliary SiGe layer 8. Although the surface of the residual part 14 shown in FIG. 9 appears to be relatively flat, in reality the surface can be very rough. It is therefore advantageous to smooth at least the surface of the residual part 14. A chemical mechanical polishing step, or a selective chemical etching step, or a combination of these processes could be used to remove the rough surface structure.

Figure 10:
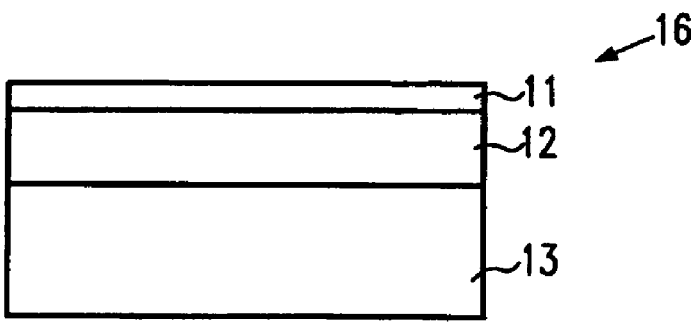
FIG. 10 shows the structure of FIG. 9 after removal of a residual part of the relaxed silicon-germanium layer.

FIG. 10 illustrates a useful structure 16 that results after removal of the residual part 14 shown in FIG. 9. A chemical etching step could be used to remove the residual part 14. For example, a chemical etching step with high selectivity of about 1:30 between the material of the former relaxed auxiliary SiGe layer 8 and the strained silicon utility layer 11 could be used. For example, a $CH_3COOH/H_2O_2/H_2O$ solution with respective concentration of 4/3/0.25, or a $NH_4OH/H_2O_2/H_2O$ solution with a respective concentration of 1/1/5 could be utilized.

Figure 11:
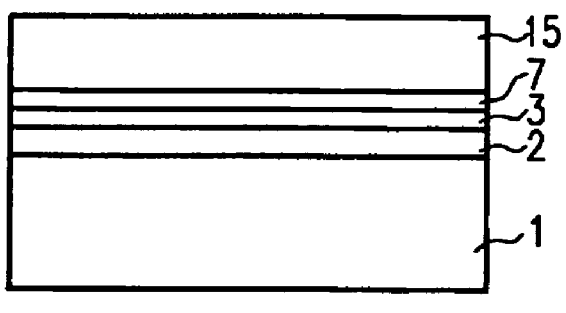
FIG. 11 shows another detached part of the structure of FIG. 8.

FIG. 11 schematically shows a second structure that results after the detachment step occurs with regard to the structure shown in FIG. 8. The second structure shown in FIG. 11 consists of the silicon support substrate 1, the insulator layer 2, the strained silicon model layer 3, the epitaxially grown second strained silicon model layer 7, and a residual part 15 of the former relaxed auxiliary SiGe layer 8. As mentioned above with regard to the residual part 14, the surface of the residual part 15 can also be relatively rough, so that smoothing of at least the surface of this layer 15 is necessary before the second structure can be recycled.

Figure 12:
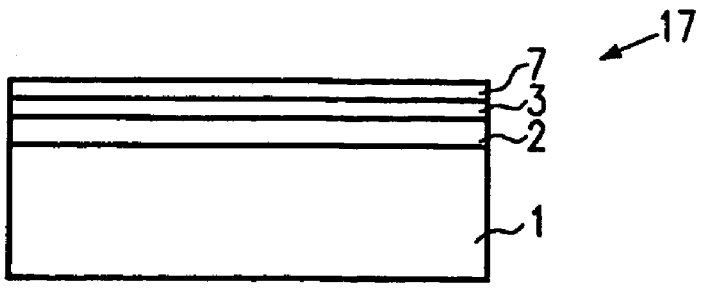
FIG. 12 is a schematic view of the structure of FIG. 111 after removal of a residual part of the former relaxed silicon-germanium layer.

FIG. 12 schematically shows a recycle structure 17 after a recycling step in which the residual part 15 shown in FIG. 11 is removed. The residual part 15 is preferably removed by a selective chemical etching step using the high etch selectivity of the material of the former relaxed auxiliary SiGe layer 8, and the additional or second strained silicon model layer 7, of about 1:30. The structure of FIG. 12 can then be recycled and used again, wherein a new relaxed auxiliary SiGe layer is formed thereon as discussed earlier with regard to FIG. 4 to repeat the entire process wherein the characteristics of the strained silicon model layer 3 are duplicated.

In summary, a method for fabricating a wafer structure with a strained silicon layer includes providing a prototype wafer having a support substrate and having a top strained silicon model layer. Next, a relaxed auxiliary SiGe layer is epitaxially grown on the strained silicon model layer, and a strained silicon utility layer is grown on the auxiliary SiGe layer. Then a portion of the structure is detached at a predetermined weakened zone created in the relaxed SiGe layer.

Thus, according to the invention, the methods for fabricating the wafer structure having a strained silicon layer has two main steps. The first is to fabricate the prototype wafer which forms a model for a utility structure, and the second is the formation of the utility structure by duplicating or cloning the characteristics of the strained silicon model layer of the prototype wafer by forming the strained silicon utility layer. Using the inventive method, the properties of the strained silicon model layer can be directly transferred to the strained silicon utility layer by using the auxiliary SiGe layer as a transmission layer between the strained silicon layers. A simple succession beginning with the strained silicon model layer, and then the auxiliary SiGe layer results in a strained silicon utility layer that is formed with a high quality in a very short time. It is furthermore relatively easy to detach a utility structure from the prototype wafer part of the structure, and to proceed separately thereafter with both structures.

According to a favorable embodiment, the method further includes removing a residual part of the auxiliary SiGe layer from the strained silicon utility layer after the detachment step. This allows for recycling of the detached utility structure. The utility structure can easily be recycled because the high etch selectivity between the relaxed auxiliary SiGe layer and the strained silicon utility layer provides for a beneficial utility structure.

In an advantageous example, the strained silicon model layer is epitaxially grown before the auxiliary SiGe layer is grown thereon. The epitaxially grown strained silicon layer compensates for any loss of thickness of the strained silicon layer during a recycling step, which can result if a chemical solution having an imperfect etching selectivity is used. In yet another favorable embodiment, the method further includes implanting atomic species into the auxiliary SiGe layer to create the predetermined zone of weakness therein. The implantation step can create a well-defined predetermined zone of weakness which can be detached mechanically, thermally, or by using shockwaves or other forces very efficiently. In another example, the technique may include bonding a second wafer onto the strained silicon utility layer. The second wafer provides a good stable support for the strained silicon utility layer during the detachment step, and can form a good basis for further use of the strained silicon utility layer. It is also advantageous for the method to include growing an SiGe utility layer on the strained silicon utility layer before the detachment step. This way, an SGOI (silicon-germanium-on-insulator) utility structure can be formed after detachment.

In another example, the method includes bonding a second wafer onto the SiGe utility layer. The second wafer can form a good basis for the resulting utility structure, and can provide a good, stable support during the detachment step.

Preferably, the prototype wafer is an SOI structure consisting of a silicon support substrate, at least one insulator layer, and the strained silicon model layer directly on the insulator layer. Such a structure has to be produced only once in a conventional manner as described above, and can then serve as a model for duplicating the characteristics of the strained silicon model layer many times. In another variant, the prototype wafer is an SGOI structure consisting of a silicon support substrate, at least one insulator layer, an SiGe layer, and a strained silicon model layer. This structure can also be formed in a conventional manner, wherein the strain of the strained silicon model layer depends on the germanium concentration of the SiGe layer. The structure has to be produced only once and can serve several times for cloning or duplicating the characteristics of a strained silicon model layer.

In another advantageous embodiment, the method includes removing a residual part of the auxiliary SiGe layer from the strained silicon model layer after detachment. This allows for recycling of the prototype wafer after detachment. It is very easy to remove the auxiliary SiGe layer from the strained silicon model layer because there is a good etch selectivity between these layers.

In another aspect, an intermediate structure is provided that is suitable to fabricate a wafer structure having a strained silicon layer. The technique includes providing a prototype wafer having a support substrate and a strained silicon model layer, a relaxed auxiliary SiGe layer on the strained silicon model layer wherein a predetermined zone of weakness is formed in the relaxed auxiliary SiGe layer, and providing a strained silicon utility layer on the auxiliary SiGe layer. The thickness of the relaxed SiGe auxiliary layer should be sufficient to incorporate the defects that may be introduced by the implantation process and by the detachment step, typically >200 nm. The intermediate structure includes a strained silicon model layer having characteristics that are directly transferred or duplicated to the strained silicon utility layer. The intermediate product forms a structure which can be easily detached along the predetermined zone of weakness formed in the relaxed auxiliary SiGe layer, so that the strained silicon utility layer can be used separately from the prototype wafer after detachment.

In yet another embodiment, the intermediate structure includes a second wafer bonded onto the strained silicon utility layer. The second wafer can form a good support for the strained silicon utility layer during the detaching step and/or after detachment. In another advantageous example, the intermediate structure includes an SiGe utility layer on the strained silicon utility layer. With this structure an SGOI (silicon-germanium-on-insulator) utility structure can be formed after the detachment step.

Preferably, the intermediate structure also includes a second or further epitaxially grown strained silicon layer between the strained silicon model layer and the auxiliary SiGe layer. The second strained silicon layer can help to compensate for any changes in thickness of the strained silicon model layer during recycling of the prototype wafer.

According to a favorable variant, the prototype wafer is an SOI wafer consisting of a silicon support substrate, at least one insulator layer, and the strained silicon model layer. This type of prototype wafer only needs to be formed once in a conventional manner, and then can be used thereafter several times to transfer the strained silicon model layer characteristics to the strained silicon utility layer of the inventive structure.

In a yet further example, the prototype wafer is an SGOI wafer consisting of a silicon support substrate, at least one insulator layer, an SiGe layer, and the strained silicon model layer. The characteristics of the strained silicon model layer of such a prototype wafer can be controlled by the germanium content of the SiGe layer of the prototype wafer. As described above, this type of prototype wafer need only be produced once and then can be used often to clone or duplicate the characteristics of the strained silicon model layer when forming the strained silicon utility layer.

It should be understood that, although the steps of the present process illustrated herein have been shown and described in FIGS. 3 to 12 in relation to the prototype wafer 4 of FIG. 1, these steps can also be applied to other prototype wafers. For example, the prototype wafer 6 of FIG. 2 could be used, or another type of prototype wafer having at least a support substrate and strained silicon layer which can be used as strained silicon model layer could be utilized.

What is claimed is:

1. A method for fabricating a wafer structure having a strained silicon utility layer, comprising:
   providing a prototype wafer as a silicon on insulator structure which comprises at least a support substrate, a strained silicon model layer upon the support substrate, and at least one insulator layer between the support substrate and the strained silicon model layer;
   providing a relaxed silicon-germanium layer on the strained silicon model layer;
   providing a strained silicon utility layer on the relaxed silicon-germanium layer to form an intermediate structure, wherein the strained silicon utility layer has the same strain characteristics as the strained silicon model layer;
   detaching the strained silicon utility layer from the intermediate structure at a predetermined zone of weakness in the relaxed silicon-germanium layer to form a wafer structure having a strained silicon utility layer; and
   removing any residual portions of the relaxed silicon-germanium layer from the strained silicon model layer after the detachment step so that the prototype wafer can be recycled.

2. The method of claim 1, wherein the relaxed silicon-germanium layer, the strained silicon utility layer, or both layers are provided by epitaxial growing of the layer.

3. The method of claim 2, wherein both layers are provided by epitaxial growing, and the method further comprises epitaxially growing the strained silicon model layer before epitaxially growing the relaxed silicon-germanium layer thereon.

4. The method of claim 1, which further comprises providing the relaxed silicon-germanium layer at a sufficient thickness to accommodate the predetermined zone of weakness therein.

5. The method of claim 4, which further comprises implanting atomic species into the relaxed silicon germanium layer to create the predetermined zone of weakness therein.

6. The method of claim 1, which further comprises, prior to the detaching step, bonding a second wafer to the strained silicon utility layer.

7. The method of claim 1, which further comprises, prior to the detaching step, growing a silicon-germanium utility layer on the strained silicon utility layer.

8. The method of claim 7, which further comprises bonding a second wafer onto the silicon-germanium utility layer before the detaching step.

9. The method claim 1, wherein the support substrate is a silicon support substrate.

10. The method of claim 1, wherein the prototype wafer is a silicon-germanium on insulator structure that includes at least one insulator layer and a silicon-germanium layer between the silicon support substrate and the strained silicon model layer.

11. The method of claim 1 which further comprises providing a new strained silicon model layer upon the support substrate and repeating the method to obtain another wafer structure having a strained silicon utility layer.

12. The method of claim 11, wherein the new strained silicon utility layer is provided by epitaxial growing.

13. A method for fabricating a wafer structure having a strained silicon utility layer, comprising:
   providing a prototype wafer as a silicon on insulator structure which comprises at least a support substrate, a strained silicon model layer upon the support substrate, and at least one insulator layer between the support substrate and the strained silicon model layer;
   providing a relaxed silicon-germanium layer on the strained silicon model layer;
   providing a strained silicon utility layer on the relaxed silicon-germanium layer to form an intermediate structure, wherein the strained silicon utility layer has the same strain characteristics as the strained silicon model layer;

implanting atomic species into the relaxed silicon germanium layer to create the predetermined zone of weakness therein;

detaching the strained silicon utility layer from the intermediate structure at the predetermined zone of weakness in the relaxed silicon-germanium layer to form a wafer structure having a strained silicon utility layer; and removing any residual portions of the relaxed silicon-germanium layer from the strained silicon model layer after the detachment step so that the prototype wafer can be recycled, thus allowing the prototype wafer to only need to be formed once in a conventional manner, and then be used thereafter several times to transfer characteristics of the strained silicon model layer of the prototype wafer to the strained silicon utility layer of the formed wafer structure.

* * * * *